United States Patent
Chang et al.

(10) Patent No.: US 12,288,815 B2
(45) Date of Patent: Apr. 29, 2025

(54) SOURCE/DRAIN STRUCTURE WITH ENHANCED DOPANT DIFFUSION FOR SEMICONDUCTOR DEVICE

(71) Applicant: Taiwan Semiconductor Manufacturing Co., Ltd., Hsinchu (TW)

(72) Inventors: Hsiao-Chun Chang, Hsinchu County (TW); Guan-Jie Shen, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 18/421,121

(22) Filed: Jan. 24, 2024

(65) Prior Publication Data
US 2024/0194766 A1    Jun. 13, 2024

Related U.S. Application Data

(63) Continuation of application No. 17/873,821, filed on Jul. 26, 2022, now Pat. No. 11,923,439, which is a continuation of application No. 16/996,707, filed on Aug. 18, 2020, now Pat. No. 11,404,274.

(51) Int. Cl.
| | |
|---|---|
| *H01L 29/66* | (2006.01) |
| *H01L 21/02* | (2006.01) |
| *H01L 29/78* | (2006.01) |

(52) U.S. Cl.
CPC .. *H01L 29/66795* (2013.01); *H01L 21/02532* (2013.01); *H01L 29/785* (2013.01)

(58) Field of Classification Search
CPC ......... H01L 29/66795; H01L 21/02532; H01L 29/785; H01L 29/161; H01L 29/165; H01L 29/66545; H01L 29/7848; H01L 21/823431
See application file for complete search history.

(56) References Cited

U.S. PATENT DOCUMENTS

| | | | |
|---|---|---|---|
| 11,404,274 | B2 | 8/2022 | Chang et al. |
| 11,923,439 | B2 * | 3/2024 | Chang ............... H01L 21/02532 |
| 2010/0252862 | A1 | 10/2010 | Ko et al. |
| 2016/0056290 | A1 | 2/2016 | Tsai et al. |
| 2017/0054023 | A1 * | 2/2017 | Li .......................... H01L 21/845 |
| 2017/0140996 | A1 * | 5/2017 | Lin ........................ H01L 29/785 |
| 2017/0256609 | A1 | 9/2017 | Bhuwalka et al. |
| 2019/0198639 | A1 * | 6/2019 | Kim .................. H01L 29/66795 |
| 2020/0381547 | A1 * | 12/2020 | Song .................. H01L 29/78696 |
| 2020/0395446 | A1 | 12/2020 | Yi et al. |
| 2021/0082914 | A1 | 3/2021 | Lee et al. |
| 2021/0217860 | A1 | 7/2021 | Ha et al. |

\* cited by examiner

*Primary Examiner* — Changhyun Yi
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, a fin structure over the substrate, a gate structure over a first portion of the fin structure, and an epitaxial region formed in a second portion of the fin structure. The epitaxial region can include a first semiconductor layer and an n-type second semiconductor layer formed over the first semiconductor layer. A lattice constant of the first semiconductor layer can be greater than that of the second semiconductor layer.

20 Claims, 15 Drawing Sheets

SOURCE/DRAIN STRUCTURE WITH ENHANCED DOPANT DIFFUSION FOR SEMICONDUCTOR DEVICE

RELATED APPLICATION

This application is a continuation of U.S. patent application Ser. No. 17/873,821, filed on Jul. 26, 2022, titled "Source/Drain Structure for Semiconductor Device," which is a continuation of U.S. patent application Ser. No. 16/996,707 (now U.S. Pat. No. 11,404,274), filed on Aug. 18, 2020, titled "Source/Drain Structure for Semiconductor Device," which are both incorporated herein by reference in their entireties.

BACKGROUND

Advances in semiconductor technology has increased the demand for field effect transistors (FETs) with higher performance for faster processing systems. To meet this demand, it is important to reduce the FET's channel resistance to minimize the transistor delay (e.g., resistive-capacitive (RC) delay). An underlap between the FET's gate terminal and the FET's source/drain terminal can contribute to the FET's channel resistance.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
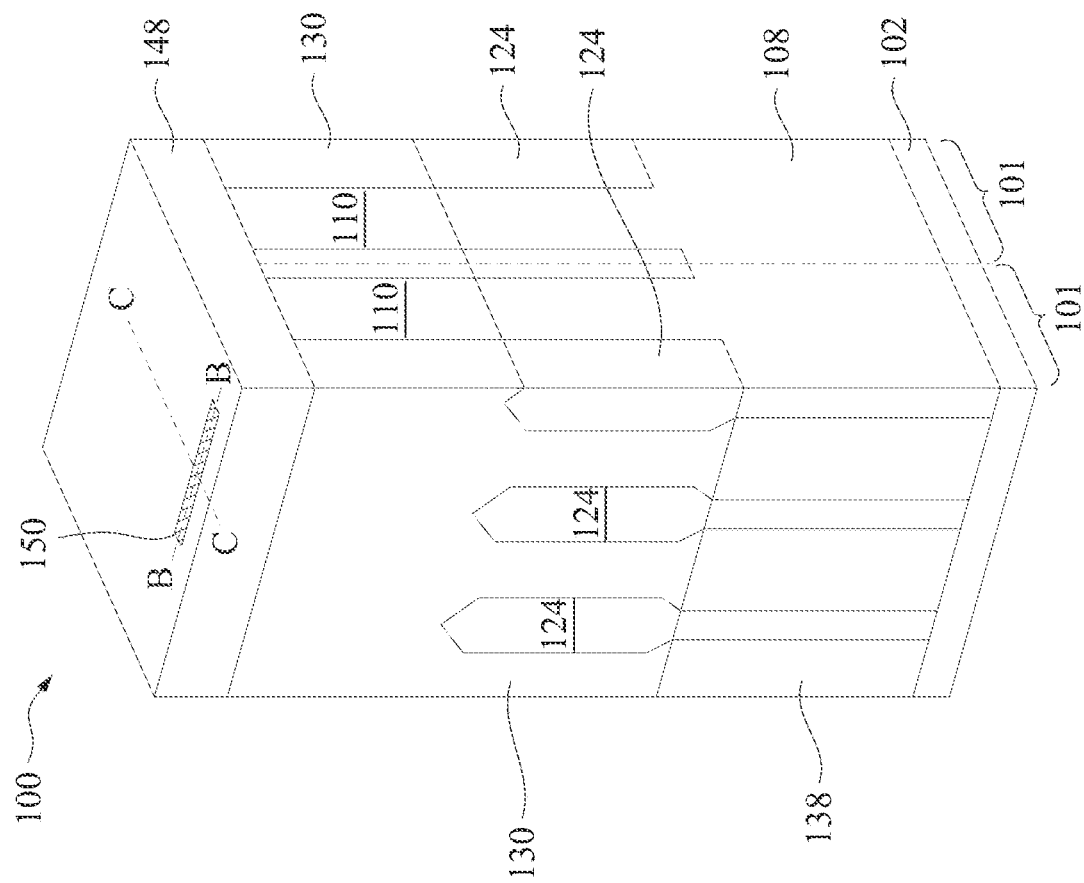
FIG. 1A is an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

As used herein, the term "insulating layer" refers to a layer that functions as an electrical insulator (e.g., a dielectric layer).

As used herein, the term "p-type" defines a structure, layer, and/or region as being doped with p-type dopants, such as boron.

As used herein, the term "n-type" defines a structure, layer, and/or region as being doped with n-type dopants, such as phosphorus and arsenic.

Fins associated with fin field effect transistors (finFETs) or gate-all-around (GAA) FETs may be patterned by any suitable method. For example, the fins may be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The self-aligned gate process that eliminates the need to align the gate electrode to the source/drain (S/D) region can be used in the fabrication of semiconductor transistors. However, the self-aligned gate process can cause an insufficient overlap (e.g., an underlap) between the gate electrode and the S/D region. Such underlap can increase the transistor's channel resistance, thus degrading the transistor's performance.

To address the aforementioned challenges, this disclosure is directed to a fabrication method and structures that provide a reduced channel resistance for a transistor. For example, the transistor can include a channel region, a S/D region doped with dopants, and a diffusion enhancement layer sandwiched between the channel region and the S/D region. The diffusion enhancement layer can enhance the diffusion of dopants from the S/D region towards the channel region. In some embodiments, the transistor can be an n-channel field effect transistor (NFET), where the dopants can be arsenic or phosphorus. In some embodiments, the S/D region can be made of an n-type silicon layer, where the diffusion enhancement layer can be a silicon germanium layer. In some embodiments, the diffusion enhancement layer can be the silicon germanium layer with a germanium concentration less than 10% and a thickness less than about 5 nm. With the diffusion of the dopants from the S/D region towards the channel region, the transistor's channel resistance can be reduced. Accordingly, a benefit of the present disclosure, among others, is to boost the transistor's on-current, thus improving transistor performance (e.g., speed).

Figure 1B:
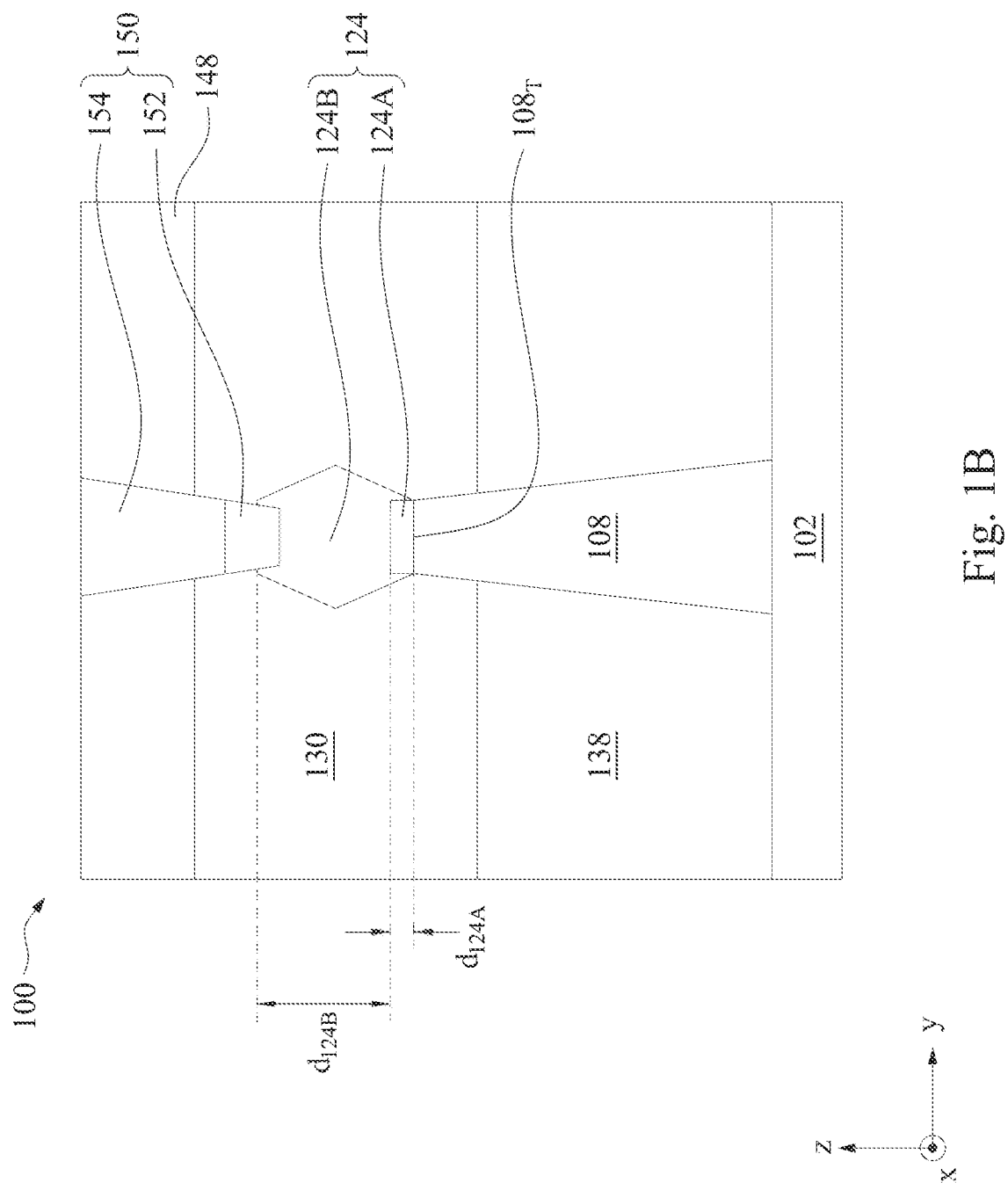
FIGS. 1B, 1C, 1D, and 1E are cross-sectional views of a semiconductor device, according to some embodiments.
Figure 1C:
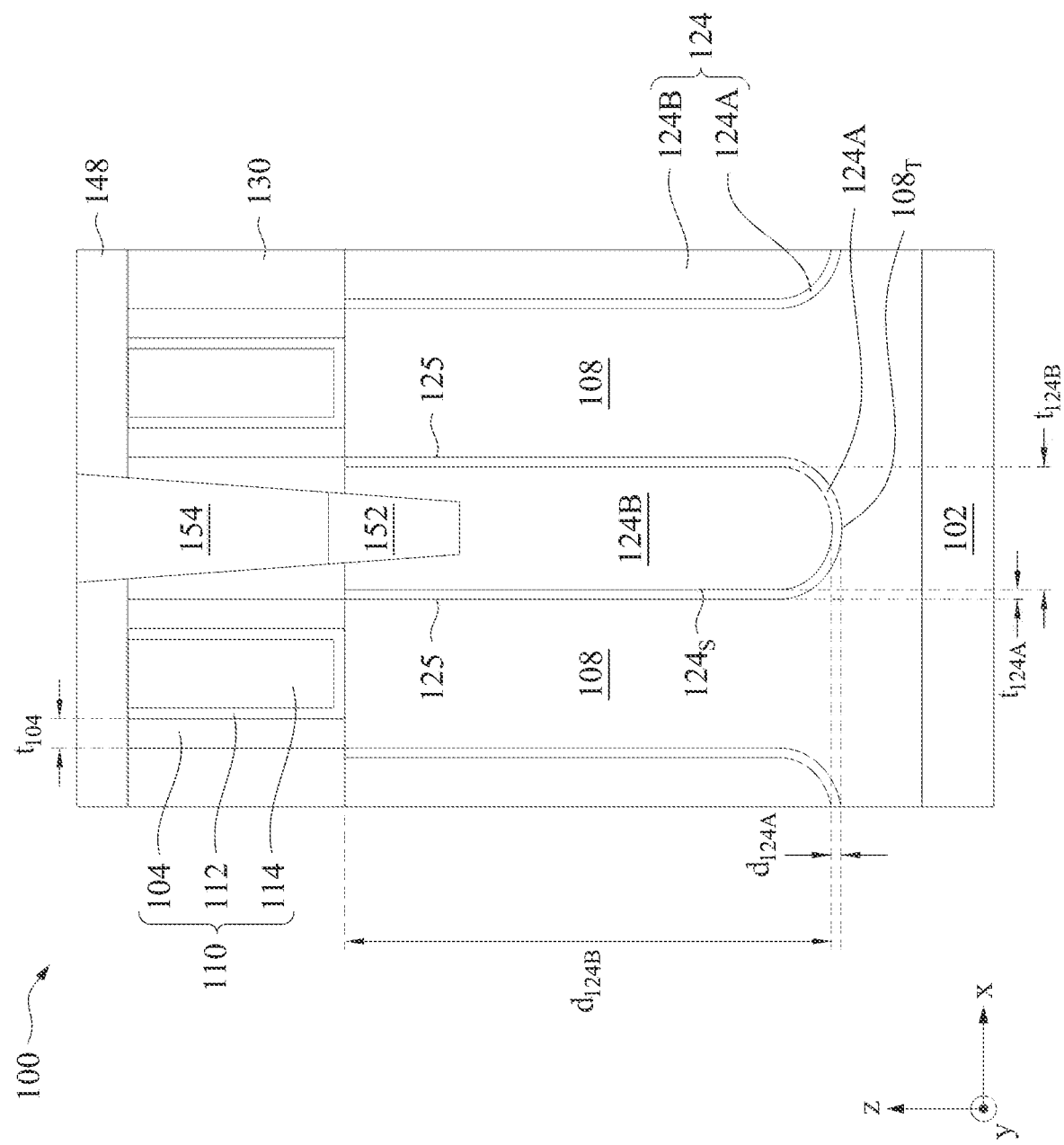
Figure 1D:
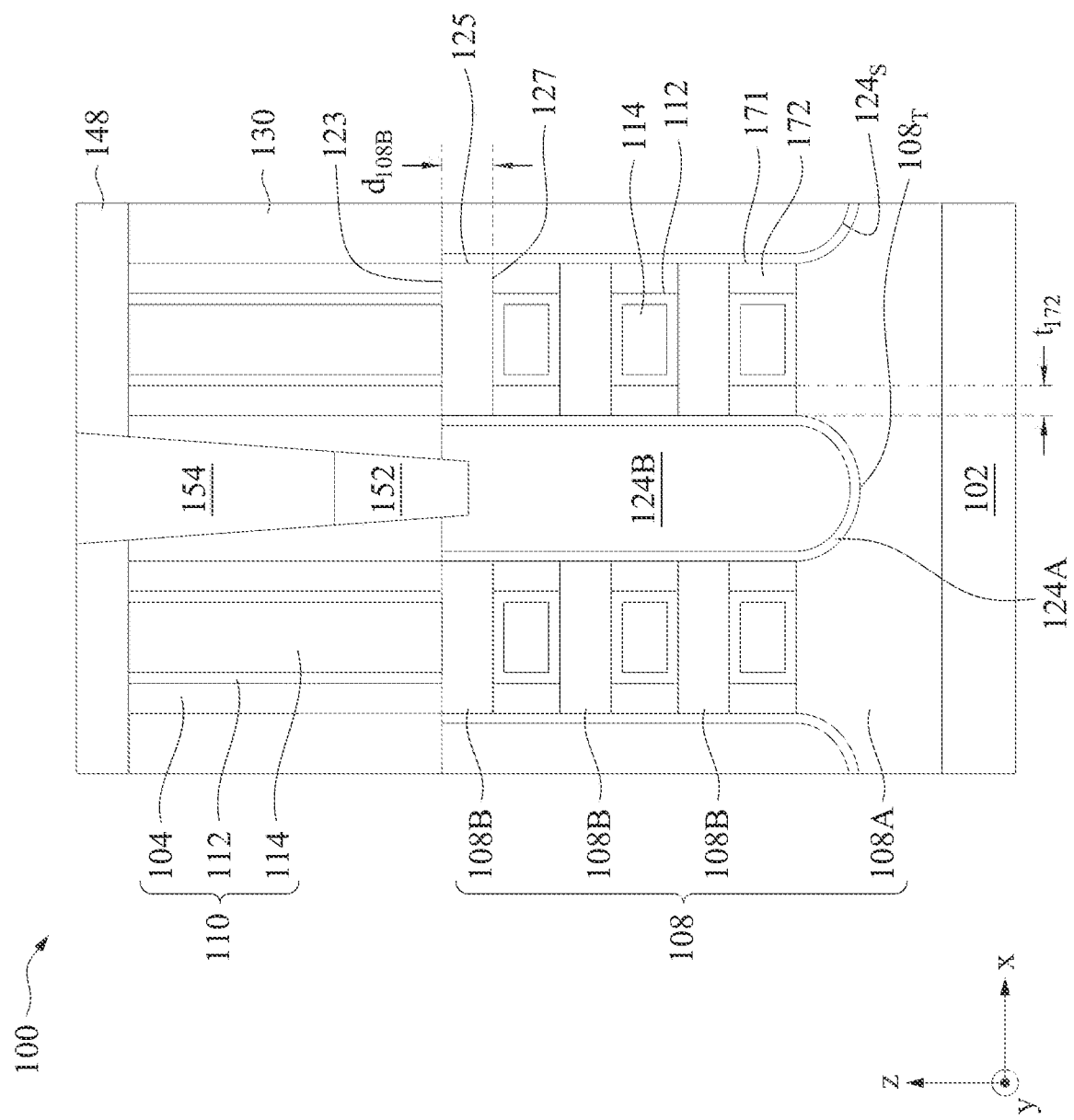
Figure 1E:
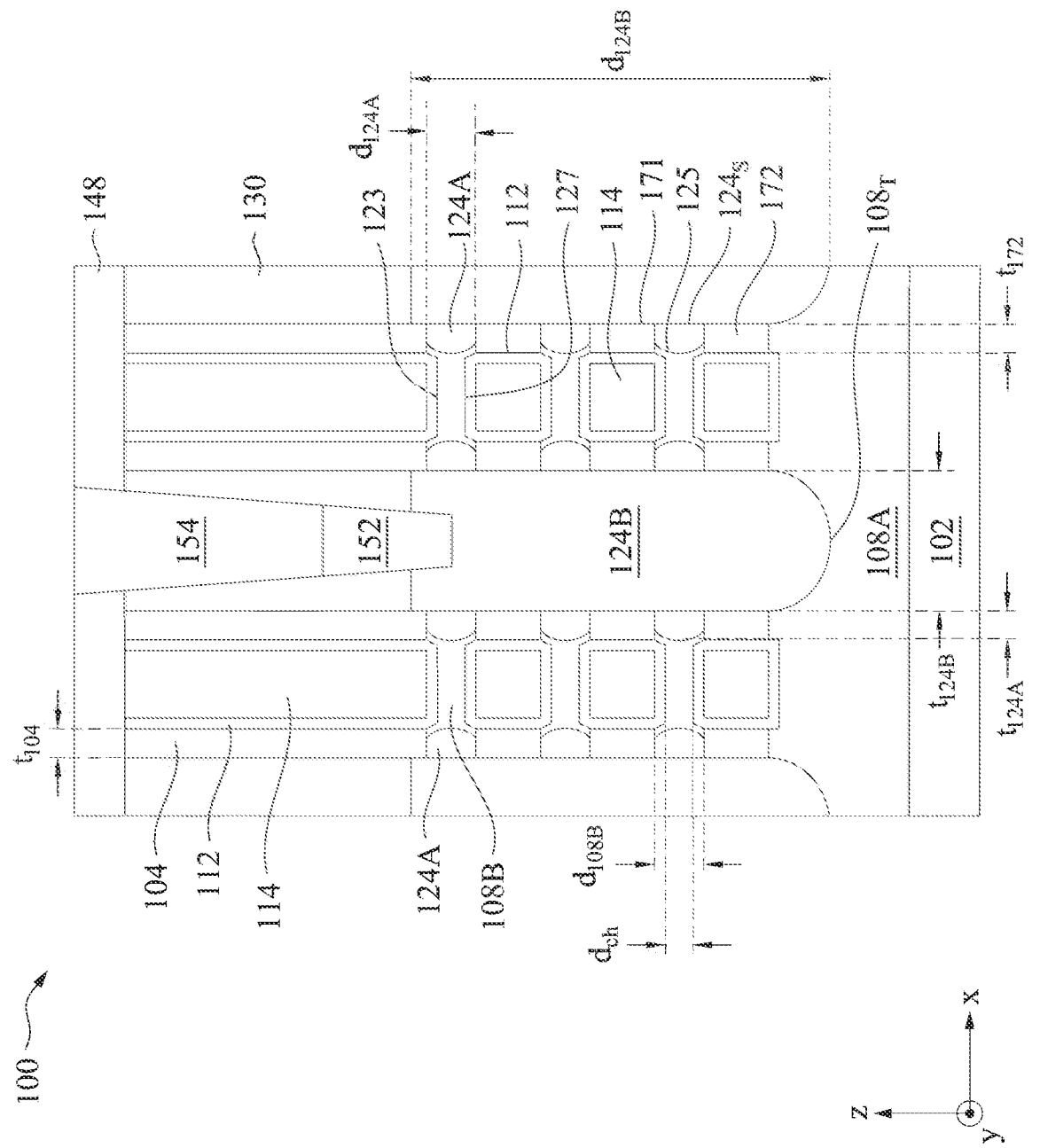

A semiconductor device 100 having multiple field effect transistors (FETs) 101 formed over a substrate 102 is described with reference to FIGS. 1A-1E, according to some embodiments. Semiconductor device 100 can be included in a microprocessor, memory cell, or other integrated circuit (IC). FIG. 1A illustrates an isometric view of semiconductor device 100, according to some embodiments. FIG. 1B illustrates a cross-sectional view along a source/drain (S/D) region (e.g., line B-B of FIG. 1A) of semiconductor device 100, where FET 101 can be a fin field effect transistor (finFET), according to some embodiments. FIG. 1C illustrate a cross-sectional view along a channel direction (e.g., line C-C of FIG. 1A) of semiconductor device 100, where FET 101 can be a fin field effect transistor (finFET), according to some embodiments. FIGS. 1D and 1E illustrate cross-sectional views along a channel direction (e.g., line C-C of FIG. 1A) of semiconductor device 100, where FET 101 can be a gate-all-around (GAA) FET, according to some embodiments. The discussion of elements in FIGS. 1A-1E with the same annotations applies to each other, unless mentioned otherwise.

Referring to FIG. 1A, substrate 102 can be a semiconductor material, such as silicon. In some embodiments, substrate 102 can include a crystalline silicon substrate (e.g., wafer). In some embodiments, substrate 102 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Each FET 101 can include a fin structure 108 extending along an x-axis, a gate structure 110 traversing through fin structure 108 along a y-axis, and S/D regions 124 formed over portions of fin structure 108. The portion of fin structure 108 traversed by gate structure 110 can be FET 101's channel region. In some embodiments, FET 101 can be an n-channel FET (NFET), where FET 101's channel region can conduct electron carriers. In some embodiments, FET 101 can be a p-channel FET (PFET), where FET 101's channel region can conduct hole carriers. Although FIG. 1A shows each fin structure 108 accommodating two FETs 101, any number of FETs 101 can be disposed along each fin structure 108. In some embodiments, FET 101 can include multiple fin structures 108 extending along a first horizontal direction (e.g., in the x-direction) and gate structure 110 traversing through the multiple fin structures 108 along a second horizontal direction (e.g., in the y-direction). In some embodiments, multiple FETs 101 can have a common gate structure 110.

Each fin structure 108 can be formed over substrate 102 and can include a material similar to substrate 102. For example, fin structure 108 can include a material having a lattice constant substantially equal to (e.g., lattice mismatch within 5%) that of substrate 102. In some embodiments, fin structure 108 can include a material identical to substrate 102. Fin structure 108 can accommodate FET 101's channel region that is traversed by gate structure 110. In some embodiments, FET 101's channel region can be made of a material having a lattice constant substantially equal to (e.g., lattice mismatch within 5%) that of substrate 102. Fin structure 108 can be p-type doped, n-type doped, or un-doped. In some embodiments, FET 101 can be an NFET, where fin structure 108 can be un-doped or doped with p-type dopants, such as boron, indium, aluminum, and gallium. In some embodiments, FET 101 can be a PFET, where fin structure 108 can be un-doped or doped with n-type dopants, such as phosphorus and arsenic.

Semiconductor device 100 can further include shallow trench isolation (STI) regions 138 configured to provide electrical isolation between fin structures 108. Also, STI regions 138 can provide electrical isolation between FETs 101 and neighboring active and passive elements (not shown in FIG. 1A) integrated with or deposited on substrate 102. STI regions 138 can include one or more layers of dielectric material, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials.

Referring to FIGS. 1A and 1C, gate structure 110 can be multi-layered structures that wraps around portions of one or more fin structures 108 to modulate FET 101. In some embodiments, gate structure 110 can be referred to as gate-all-around (GAA) structures, where FET 101 can be referred to as a GAA FET 101. Gate structure 110 can include a gate dielectric layer 112, a gate electrode 114 disposed on gate dielectric layer 112, and gate spacers 104 disposed on sidewalls of gate dielectric layer 112.

Gate dielectric layer 112 can be wrapped around portions of fin structure 108 and can be further disposed between gate electrode 114 and S/D regions 124 to prevent an electrical short in between. Gate dielectric layer 112 can include any suitable dielectric material with any suitable thickness that can provide channel modulation for FET 101. In some embodiments, gate dielectric layer 112 can include silicon oxide and a high-k dielectric material (e.g., hafnium oxide or aluminum oxide), and gate dielectric layer 112 can have a thickness ranging from about 1 nm to about 5 nm. Other materials and thicknesses for gate dielectric layer 112 are within the scope and spirit of this disclosure.

Gate electrode 114 can function as a gate terminal for FET 101. Gate electrode 114 can include a metal stack wrapping around portions of fin structure 108. Gate electrode 114 can include any suitable conductive material that provides a suitable work function to modulate FET 101. In some embodiments, gate electrode 114 can include titanium nitride, tantalum nitride, tungsten nitride, titanium, aluminum, copper, tungsten, tantalum, copper, or nickel (Ni). Other materials for gate electrode 114 are within the scope and spirit of this disclosure.

Gate spacer 104 can be in physical contact with gate dielectric layers 112, according to some embodiments. Gate spacer 104 can have a low-k material with a dielectric constant less than about 3.9. For example, gate spacer 104 can include insulating material, such as silicon oxide, silicon nitride, a low-k material, and a combination thereof. In some embodiments, gate spacer 104 can have a thickness $t_{104}$ ranging from about 2 nm to about 10 nm. Other materials and thicknesses for gate spacer 104 are within the scope and spirit of this disclosure.

Each FET 101 can have S/D regions 124 formed at opposite sides (e.g., along x-direction) of FET 101's channel region. For example, S/D region 124 can be formed over portions of fin structure 108 that are at opposite sides (e.g., along x-direction) of gate structure 110. S/D region 124 can be made of a semiconductor material, such as an element semiconductor material (e.g., Si or Ge), a compound semiconductor material (e.g., GaAs or AlGaAs), a semiconductor alloy (e.g., SiGe or GaAsP), and a semiconductor monopnictide (e.g., silicon arsenic, silicon phosphorus). In some embodiments, FET 101 can be an NFET, where S/D region 124 can be doped with n-type dopants (e.g., phosphorus, arsenic, sulfur, or selenium) to provide electron carriers for FET 101. In some embodiments, FET 101 can be a PFET, where S/D region 124 can be doped with p-type dopants (e.g., boron, indium, aluminum, gallium, zinc, beryllium, or magnesium) to provide hole carriers for FET 101.

Referring to FIGS. 1B and 1C, S/D region 124 can be a layer stack of epitaxially-grown semiconductor material. For example, S/D region 124 can include a first layer 124A and a second layer 124B formed over first layer 124A. First layer 124A can be formed over fin structure 108. For example, first layer 124A can be formed over a top surface $108_T$ of portions of fin structure 108 that are laterally (e.g., in the x-direction) outside gate structure 110. First layer 124A can be further formed over a side surface 125 of portions of fin structure 108 that are traversed by gate structure 110 (e.g., side surface 125 belongs to FET 101's channel region's side surface). First layer 124A can include a semiconductor material that can enhance the dopants (e.g., phosphorus or arsenic), originally doped in second layer 124B, diffusing from second layer 124B towards FET 101's channel region, such as towards fin structure 108's side surface 125. For example, first layer 124A can include a semiconductor material that has a greater lattice constant than FET 101's channel region (e.g., first layer 124A can have a greater lattice constant than fin structure 108). Such first layer 124A having greater lattice constant than fin structure 108 can provide a driving force to enhance the dopants, doped in second layer 124B, diffusing from second layer 124B towards FET 101's channel region (e.g., towards side surfaces 125), thus reducing FET 101's channel resistance. In some embodiments, first layer 124A can be made of a semiconductor material that has a lattice constant greater than lattice constants of both fin structure 108 and second layer 124B to enhance the dopants diffusing from second layer 124B to fin structure 108. In some embodiments, first layer 124A can be made of an un-doped SiGe or an n-type SiGe, where FET 101 can be an NFET having the channel region made of a silicon layer that includes side surfaces 125 (e.g., fin structure 108 can be made of a silicon layer that includes side surfaces 125). In some embodiments, first layer 124A can be made of an un-doped SiGe or an n-type SiGe with a germanium concentration from about 0.5% to about 15%, from about 1% to about 10%, or from about 1% to about 5%, where FET 101 can be an NFET having the channel region made of a silicon layer that includes side surfaces 125. The above-noted germanium concentration's upper limits for first layer 124A are to avoid degrading FET 101's electron mobility by minimizing the compressive stress induced in FET 101's channel region (e.g., an n-channel). Further, the above-noted germanium concentration's lower limits for first layer 124A are to provide sufficient driving force to diffuse the dopants from second layer 124B towards FET 101's channel region (e.g., towards side surfaces 125). First layer 124A can have a vertical (e.g., in the z-direction) thickness $d_{124A}$ measured from top surface $108_T$, and a lateral (e.g., in the x-direction) thickness $t_{124A}$ measured from side surface 125. In some embodiments, each of vertical thickness $d_{124A}$ and lateral thickness $t_{124A}$ can be from about 0.5 nm to about 10 nm, from about 0.5 nm to about 7 nm, or from about 1 nm to about 5 nm. The above-noted thickness' upper limits are to ensure that the dopants can diffuse through first layer 124A to reach sides surface 125. Further, the above-noted thickness' lower limits are to ensure first layer 124A can be a continuous monolayer over side surface 125. In some embodiments, vertical thickness $d_{124A}$ can be greater than or substantially equal to lateral thickness $t_{124A}$, where top surface $108_T$ can be substantially parallel to (100) crystalline plane. First layer 124A can have a suitable dopant type associated with FET 101. For example, FET 101 can be an NFET, where first layer 124A can be un-doped or doped with n-type dopants (e.g., phosphorus or arsenic). In some embodiments, FET 101 can be a PFET, where first layer 124A can be un-doped or doped with p-type dopants (e.g., boron).

Second layer 124B can include a semiconductor material that has a doping type (e.g., p-type or n-type) associated with FET 101. For example, FET 101 can be an NFET, where second layer 124B can include an n-type semiconductor material that provides electrons for FET 101's channel region. In some embodiments, FET 101 can be an NFET having the channel region made of a silicon layer that includes side surfaces 125, where second layer 124B can be made of another n-type silicon layer doped with n-type dopants, such as phosphorus and arsenic. In some embodiments, second layer 124B can be doped with an n-type dopant having a concentration greater than about $5\times10^{20}/cm^3$, greater than about $1\times10^{21}/cm^3$, or greater than about $2\times10^{21}/cm^3$ to lower contact resistance for FET 101. If the n-type dopant concentration is below the above-noted lower limits, FET 101 may be susceptible to a high contact resistance. In some embodiments, first layer 124A and second layer 124B can be respectively doped with n-type dopants having first and second doping concentrations, where the first doping concentration can be less than or equal to the second doping concentration to minimize FET 101's short channel effect. In some embodiments, first layer 124A can be doped with n-type dopants having doping concentrations less than $1\times10^{21}/cm^3$, less than about $5\times10^{20}/cm^3$, or less than about $3\times10^{20}/cm^3$. If the n-type dopant concentration is beyond the above-noted upper limits, FET 101 may be susceptible to short channel effect.

Second layer 124B can include a semiconductor material that has a lattice constant associated with FET 101. For example, FET 101 can be an NFET, where second layer 124B can include an n-type semiconductor material having a lattice constant less than or equal to the lattice constant of FET 101's channel region (e.g., second layer 124B can have a lattice constant less than or equal to fin structure 108), such that second layer 124B can induce a tensile stress (e.g., avoid inducing compressive stress) in FET 101's channel region to boost FET 101's electron mobility. In some embodiments, FET 101 can be an NFET having the channel region made of a silicon layer that includes side surfaces 125, where second layer 124B can include a semiconductor monopnictide, such as silicon arsenic and silicon phosphorus. In some embodiments, FET 101 can be an NFET having the channel region made of a silicon layer, where second layer 124B can be made of another silicon layer doped with n-type dopants (e.g., phosphorus or arsenic). In some embodiments, FET 101 can be an NFET, where second layer 124B can be free from semiconductor materials having lattice constant greater than the lattice constant of FET 101's channel region (e.g., second layer 124B cannot have a lattice constant greater than fin structure 108) to avoid inducing compressive stress in FET 101's channel region to degrade FET 101's electron mobility. For example, FET 101 can be an NFET having the channel region made of a silicon layer that includes side surfaces 125, where second layer 124B can be made of an n-type semiconductor material free from germanium or SiGe (e.g., second layer 124B does not contain germanium and/or SiGe) to avoid inducing a compressive stress in FET 101's channel region to degrade FET 101's electron mobility. In some embodiments, first layer 124A and second layer 124B can be made of silicon germanium layers respectively with first and second germanium concentrations, where the second germanium can be less than or equal to the first germanium concentration to minimize inducing the compressive stress in FET 101's channel region. In some embodiments, FET 101 can be an NFET, where second layer 124B can include multiple layers of semiconductor materials (not shown in FIGS. 1B-1E). The mean, median, or weighted mean (e.g., weights of the weighted mean can be the volume or thickness of each of multiple layers of semiconductor materials) of the lattice constants of the multiple layers of semiconductor materials can be less than or equal to the lattice constant of FET 101's channel region, such that second layer 124B can induce a tensile stress (e.g., avoid inducing compressive stress) in FET 101's channel region to boost FET 101's electron mobility. In some embodiments, FET 101 can be an NFET, where the mean, median, or weighted mean (e.g., weights of the weighted mean can be the vertical/lateral thicknesses of first layer 124A and second layer 124B) of the lattice constants of first layer 124A and second layer 124B can be less than or equal to the lattice constant of FET 101's channel region, such that first layer 124A in combination with second layer 124B can induce a tensile stress (e.g., avoid inducing compressive stress) in FET 101's channel region to boost FET 101's electron mobility.

In some embodiments, FET 101 can be a PFET, where second layer 124B can be un-doped or doped with p-type dopants (e.g., boron). Second layer 124B can physically contact with first layer 124A along a junction $124_s$. In some embodiments, junction $124_s$ can be substantially parallel to side surfaces 125. Second layer 124B can have a vertical (e.g., in the z-direction) thickness $d_{124B}$ measured from portions of junction $124_s$ that are laterally (e.g., in the x-y plane) in the perimeter of top surface $108_T$. Second layer 124B can have a lateral (e.g., in the x-direction) thickness $t_{124B}$ measured from a lateral (e.g., in the x-direction) separation between side surface 125 and junction $124_s$. Second layer 124B can be thicker than first layer 124A to provide a sufficient driving current (e.g., supplying sufficient electrons) and a sufficient stress (e.g., compressive stress) to FET 101's channel region. Namely, vertical thickness $d_{124B}$ can be greater than vertical thickness $d_{124A}$, and lateral thickness $t_{124B}$ can be greater than lateral thickness $t_{124A}$. In some embodiments, a ratio of lateral thickness $t_{124B}$ to lateral thickness $t_{124A}$ can be greater than about 5, greater than about 10, or greater than about 15 to provide a sufficient driving current and/or a sufficient stress to FET 101's channel region. If the ratio of lateral thickness $t_{124B}$ to lateral thickness $t_{124A}$ is below the above-noted lower limits, S/D region 124 may not provide sufficient driving current and/or sufficient stress to FET 101's channel region. In some embodiments, a ratio of vertical thickness d 124B to vertical thickness $d_{124A}$ can be greater than about 25, greater than about 50, or greater than about 75 to provide a sufficient driving current and/or a sufficient stress to FET 101's channel region. If the ratio of vertical thickness $d_{124B}$ to vertical thickness $d_{124A}$ is below the above-noted lower limits, S/D region 124 may not provide sufficient driving current and/or sufficient stress to FET 101's channel region.

Semiconductor device 100 can further include an interlayer dielectric (ILD) layer 130 to provide electrical isolation to structural elements it surrounds or covers, such as gate structure 110 and S/D regions 124. ILD layer 130 can be include any suitable dielectric material to provide electrical insulation, such as silicon oxide, silicon dioxide, silicon oxycarbide, silicon oxynitride, silicon oxy-carbon nitride, and silicon carbonitride. ILD layer 130 can have any suitable thickness, such as from about 50 nm to about 200 nm, to provide electrical insulation. Based on the disclosure herein, other insulating materials and thicknesses for ILD layer 130 are within the scope and spirit of this disclosure.

Semiconductor device 100 can further include a layer of insulating material 148 formed over gate structure 110 and ILD layer 130. Layer of insulating material 148 can electrically isolate gate structure 110 and S/D region 124 from an interconnect structure (not shown in FIGS. 1A-1E) formed over FET 101. Layer of insulating material 148 can be made of any suitable insulating material, such as silicon oxide, silicon nitride, a low-k dielectric material, and a high-k dielectric material. Further, layer of insulating material 148 can be made of any suitable thickness, such as from about 10 nm to about 400 nm, that can provide sufficient electrical insulation between FETs 101 and the interconnect structure (not shown in FIGS. 1A-1E) formed over FETs 101. Based on the disclosure herein, other insulating materials and thicknesses for layer of insulating material 148 are within the scope and spirit of this disclosure.

Semiconductor device 100 can further include a trench conductor structure 150 formed through layer of insulating material 148. Trench conductor structure 150 can electrically connect FET 101's S/D region 124 to the interconnect structure (not shown in FIGS. 1A-1E) formed over FET 101. In some embodiments, trench conductor structure 150 can connect FET 101's gate structure 110 to the interconnect structure formed over FET 101. In some embodiments, trench conductor structure 150 can protrude into S/D region 124. For example, as shown in FIGS. 1B and 1C, trench conductor structure 150 can include a silicide layer 152 protruding into S/D region 124 and a layer of conductive material 154 formed over silicide layer 152. Silicide layer 152 can include a metal silicide material to provide a low resistance interface between layer of conductive material 154 and S/D region 124. In some embodiments, silicide layer 152 can be formed protruding into second layer 124B. In some embodiments, silicide layer 152 can be formed protruding into first layer 124A and second layer 124B. Silicide layer 152 can be a metal silicide that can include titanium, cobalt, nickel, platinum, palladium, tungsten, molybdenum, tantalum, vanadium, chromium, silicon, or germanium. Layer of conductive material 154 can include any suitable conductive material that provide low resistance between silicide layer 152 and the interconnect structure (not shown in FIGS. 1A-1E) formed over FET 101. For example, layer of conductive material 154 can include a metallic material, such as copper, tungsten, aluminum, and cobalt. In some embodiments, layer of conductive material 154 can further include a stack of conductive materials (not shown in FIGS. 1A-1E), such as a conductive nitride material (e.g., titanium nitride or tantalum nitride), that can act as a diffusion barrier, an adhesion promotion layer, or a nucleation layer to embed the above-noted metallic materials in layer of insulating material 148. Based on the disclosure herein, other materials for silicide layer 152 and layer of conductive material 154 are within the scope and spirit of this disclosure.

In some embodiments, referring to FIG. 1D, fin structure 108 can include a buffer region 108A and one or more nano-sheet layers 108B formed over buffer region 108A. Buffer region 108A can physically contact substrate 102 and can be made of a semiconductor material identical to substrate 102 or a semiconductor material having a lattice mismatch within 5% to the lattice constant of substrate 102. Nano-sheet layer 108B can be made of a semiconductor material identical to substrate 102 or a semiconductor material having a lattice mismatch within 5% to the lattice constant of substrate 102. Gate structure 110 can wrap around each nano-sheet layer 108B to define FET 101 as GAA FET. For example, nano-sheet layer 108B can have a top surface 123 and a bottom surface 127 separated from top surface 123 with nano-sheet layer 108B's thickness $d_{108B}$. Each of top surface 123 and bottom surface 127 can physically contact gate structure 110. In some embodiments, thickness $d_{108B}$ can be any suitable thickness, such as from about 5 nm to 15 nm, for gate structure 110 to effectively modulate FET 101's channel region (e.g., nano-sheet layers 108B) without short channel effect. Nano-sheet layer 108B can further include side surfaces 125 in contact with S/D region 124. In some embodiments, nano-sheet layer 108B's side surface 125 can physically contact first layer 124A. Accordingly, first layer 124A can enhance dopant diffusing from second layer 124B to nano-sheet layer 108B, thus reducing channel resistance of FET 101 (e.g., a GAA FET). Each buffer region 108A and nano-sheet layer 108B can be p-type doped, n-type doped, or un-doped. In some embodiments, FET 101 can be an NFET, where each buffer region 108A and nano-sheet layer 108B can be un-doped or doped with p-type dopants, such as boron, indium, aluminum, and gallium. In some embodiments, FET 101 can be a PFET, where each buffer region 108A and nano-sheet layer 108B can be un-doped or doped with n-type dopants, such as phosphorus and arsenic.

In some embodiments, as shown in FIG. 1D, gate structure 110 can further include an inner spacer 172 formed between gate dielectric layer 112 and S/D region 124. For example, inner spacer 172 can physically contact gate dielectric layer 112 and first layer 124A. Inner spacer 172 can be further formed between each vertically (e.g., in the z-direction) adjacent nano-sheet layers 108B. In some embodiments, nano-sheet layer 108B's side surface 125 can be substantially coplanar with inner spacer 172's side surface 171 that is proximate to second layer 124B. In some embodiments, side surface 171 can be substantially coplanar to gate spacer 104's side surface that is proximate to ILD layer 130. Inner spacer 172 can have a low-k material with a dielectric constant less than about 3.9. For example, inner spacer 172 can include insulating material, such as silicon oxide, silicon nitride, a low-k material, or a combination thereof. In some embodiments, inner spacer 172 can have a thickness $t_{172}$ ranging from about 2 nm to about 20 nm. Other materials and thicknesses for inner spacers 172 are within the spirit and scope of this disclosure.

In some embodiments, referring to FIG. 1E, S/D region 124 can laterally (e.g., in the x-direction) protrude into portions of fin structure 108 traversed by gate structure 110. For example, as shown in FIG. 1E, S/D region 124's first layer 124A can protrude into nano-sheet layer 108B, thus being formed between two vertically (e.g., in the z-direction) adjacent inner spacers 172. In some embodiments, first layer 124A can protrude into nano-sheet layer 108B, thus being formed vertically (e.g., in the z-direction) between inner spacer 172 and gate spacer 104. Accordingly, first layer 124A can enhance dopant diffused from second layer 124B towards portions of nano-sheet layer 108B wrapped by gate electrode 114, thus further lowering FET 101's channel resistance. In some embodiments, first layer 124A can protrude into portions of nano-sheet layers 108B that is laterally (e.g., in the x-direction) in the perimeter of inner spacer 172 or gate spacer 104, where second layer 124B can physically contact buffer region 108A. Accordingly, second layer 124B's dopants (e.g., phosphorus or arsenic) can be selectively diffused towards nano-sheet layers 108B, where buffer region 108A can be free from second layer 124B's dopant diffusion, thus reducing FET 101's leakage current. In some embodiments, first layer 124A can have lateral thickness $t_{124A}$ protruding into nano-sheet layer 108B, where lateral thickness $t_{124A}$ can be less than or substantially equal to inner spacer 172's thickness $t_{172}$. In some embodiments, lateral thickness $t_{124A}$ can be less than or substantially equal to gate spacer 104's thickness $t_{104}$. In some embodiments, first layer 124A can have vertical thickness $d_{124A}$ protruding into nano-sheet layer 108B, where vertical thickness $d_{124A}$ can be substantially equal to nano-sheet layer 108B's thickness $d_{108B}$. In some embodiments, first layer 124A can protrude into nano-sheet layer 108B, where nano-sheet layer 108's side surface 125 can be a curved shape or a warped shape. In some embodiments, first layer 124A can protrude into nano-sheet layer 108B, where junction $124_s$ can be substantially coplanar with inner spacer 172's side surface 171.

In some embodiments, as shown in FIG. 1E, gate dielectric layer 112 and gate electrode 114 can both protrude into nano-sheet layer 108B to further enhance gate structure 110's channel modulation for FET 101. For example, gate dielectric layer 112 and gate electrode 114 can protrude into nano-sheet layer 108B's top surface 123 and bottom surface 127. Therefore, the separation between top surface 123 and bottom surface 127 traversed by gate dielectric layer 112 and/or gate electrode 114 can be decreased from thickness $d_{108B}$ to a thickness $d_{ch}$. Thickness den can be less than or substantially equal to thickness $d_{108B}$. In some embodiments, a ratio of thickness $d_{ch}$ to thickness $d_{108B}$ can be from about 0.05 to about 1.0, from about 0.1 to about 1.0, from about 0.2 to about 1.0, or from about 0.5 to about 1.0. If the ratio of thickness $d_{ch}$ to thickness $d_{108B}$ is below the above-noted lower limits, nano-sheet layer 108B's mechanical strength may not be sufficient to sustain nano-sheet layer 108B's structural integrity, thus causing FET 101's failure. If the ratio of thickness den to thickness $d_{108B}$ is beyond the above-noted upper limits, FET 101 may be susceptible to short channel effects.

Figure 2:
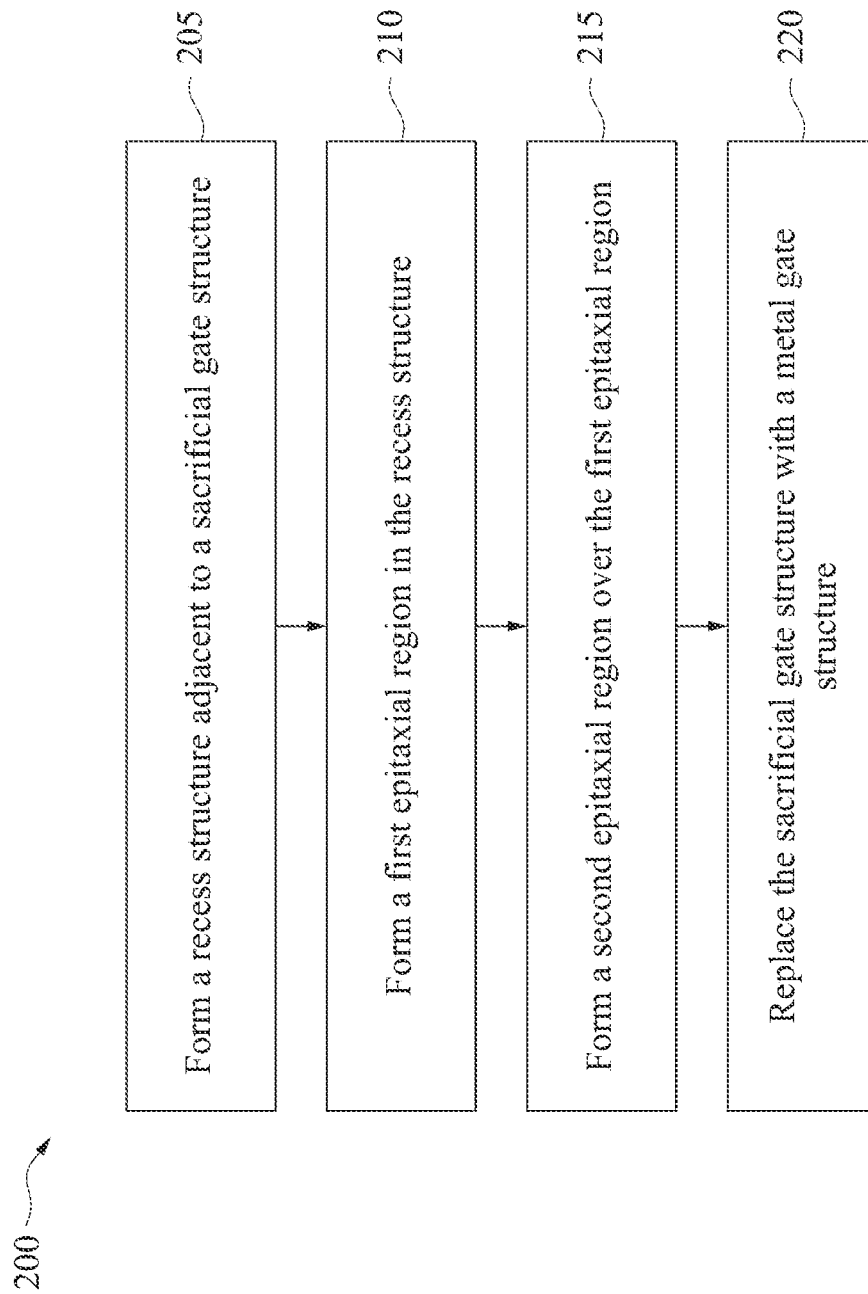
FIG. 2 is a flow diagram of a method for fabricating a semiconductor device, according to some embodiments.
Figure 3:
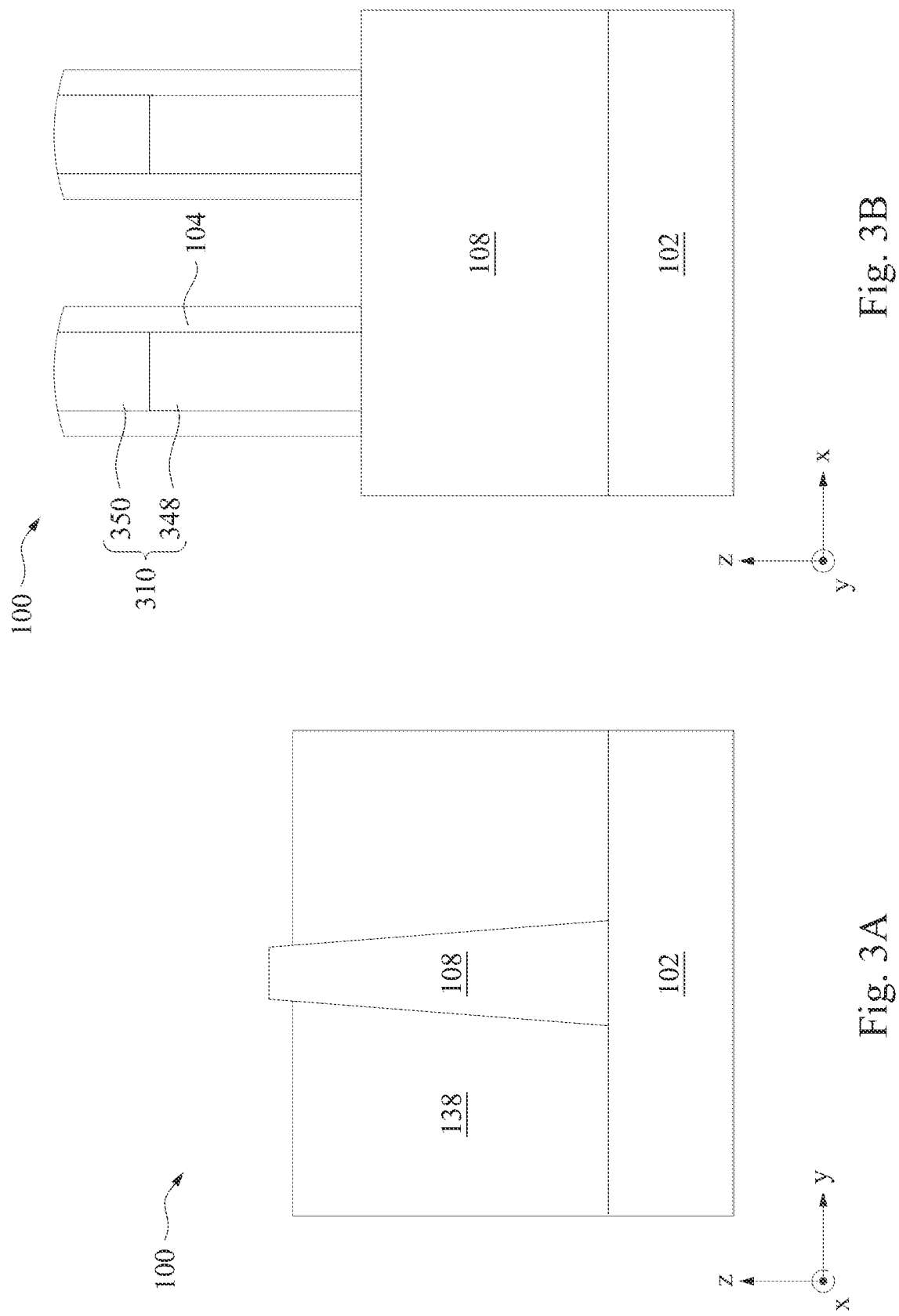
FIGS. 3A, 3B, and 4-11 are cross-sectional views of a semiconductor device at various stages of its fabrication process, according to some embodiments.

FIG. 2 is a flow diagram of a method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A, 3B, and 4-11. FIG. 3A illustrates a cross-sectional view along line B-B of structure of FIG. 1A at various stages of its fabrication, according to some embodiments. FIG. 3B illustrates a cross-sectional view along line C-C of structure of FIG. 1A at various stages of its fabrication, according to some embodiments. FIGS. 4-11 illustrate cross-sectional views along line C-C of structure of FIG. 1A at various stages of its fabrication, according to some embodiments. In some embodiments, method 200 can achieve FETs 101 as finFETs, where FIGS. 3A, 3B, 4, 6, 8, 10 can illustrate semiconductor device 100 at various stages of its fabrication. In some embodiments, method 200 can achieve FETs 101 as GAA FETs, where FIGS. 3A, 3B, 4, 5, 7, 9, 11 can illustrate semiconductor device 100 at various stages of its fabrication. Operations can be performed in a different order or not performed depending on specific applications. Method 200 may not produce a complete semiconductor device 100. Accordingly, it is understood that additional processes can be provided before, during, and/or after method 200, and that some other processes may be briefly described herein. Further, the discussion of elements in FIGS. 1A-1E, 3A, 3B, and 4-11 with the same annotations applies to each other, unless mentioned otherwise.

Referring to FIG. 2, in operation 205, a recess structure is formed adjacent to a sacrificial gate structure. For example, method 200 can achieve FETs 101 as finFETs, where a recess structure 436 (shown in FIG. 4) can be formed over substrate 102 and adjacent to a sacrificial gate structure 310 with references to FIGS. 3A, 3B, and 4. In some embodiments, method 200 can achieve FETs 101 as GAA FETs, where recess structure 436 (shown in FIG. 5) can be formed over substrate 102 and adjacent to a sacrificial gate structure 310 with references to FIGS. 3A, 3B, and 5. The process of forming recess structure 436 can include (i) forming fin structures 108 (shown in FIGS. 3A and 3B) over substrate 102; (ii) forming sacrificial gate structures 310 (shown in FIG. 3B) over fin structures 108; and (iii) removing fin structures 108 through sacrificial gate structures 310 to form recess structure 436 (shown in FIG. 4 or 5).

Referring to FIGS. 3A and 3B, the process of forming fin structures 108 can include (i) providing substrate 102; (ii) etching substrate 102 through a patterned mask layer (not shown in FIGS. 3A and 3B) using an etch process; and (iii) forming STI region 138 over the etched substrate 102 using a deposition process and an etch back process. The etch process for etching substrate 102 can include a dry etch process or a wet etch process. In some embodiments, the dry etch process can include using any suitable etchant, such as an oxygen-containing gas, a fluorine-containing gas, a chlorine-containing gas, and a bromine-containing gas, and the wet etch process can include etching in any suitable wet etchant, such as diluted hydrofluoric acid, potassium hydroxide solution, ammonia, and nitric acid. In some embodiments, the deposition process for forming STI region 138 can include any suitable growth process, such as a physical vapor deposition (PVD) process, a chemical vapor deposition (CVD) process, a high-density-plasma (HDP) CVD process, a flowable CVD (FCVD) process, and an atomic layer deposition (ALD) process. In some embodiments, the etch back process for forming STI region 138 can include a dry etch process, a wet etch process, or a polishing process, such as chemical vapor deposition (CMP) process. Based on the disclosure herein, other processes for forming fin structures 108 are within the spirit and scope of this disclosure.

The process of forming sacrificial gate structure 310 can include (i) blanket depositing a polysilicon layer 348 and a hard mask layer 350 over fin structures 108 using a suitable deposition process, such as a CVD process, a PVD process, and an ALD process; (ii) removing polysilicon layer 348 and hard mask layer 350 through a patterned mask layer (not shown in FIGS. 3A and 3B) using an etching process; and (iii) forming gate spacers 104 with thickness $t_{104}$ over sidewalls of polysilicon layer 348 using a suitable deposition process and an etch process. Based on the disclosure herein, other processes for forming sacrificial gate structures 310 are within the spirit and scope of this disclosure.

Figure 5:
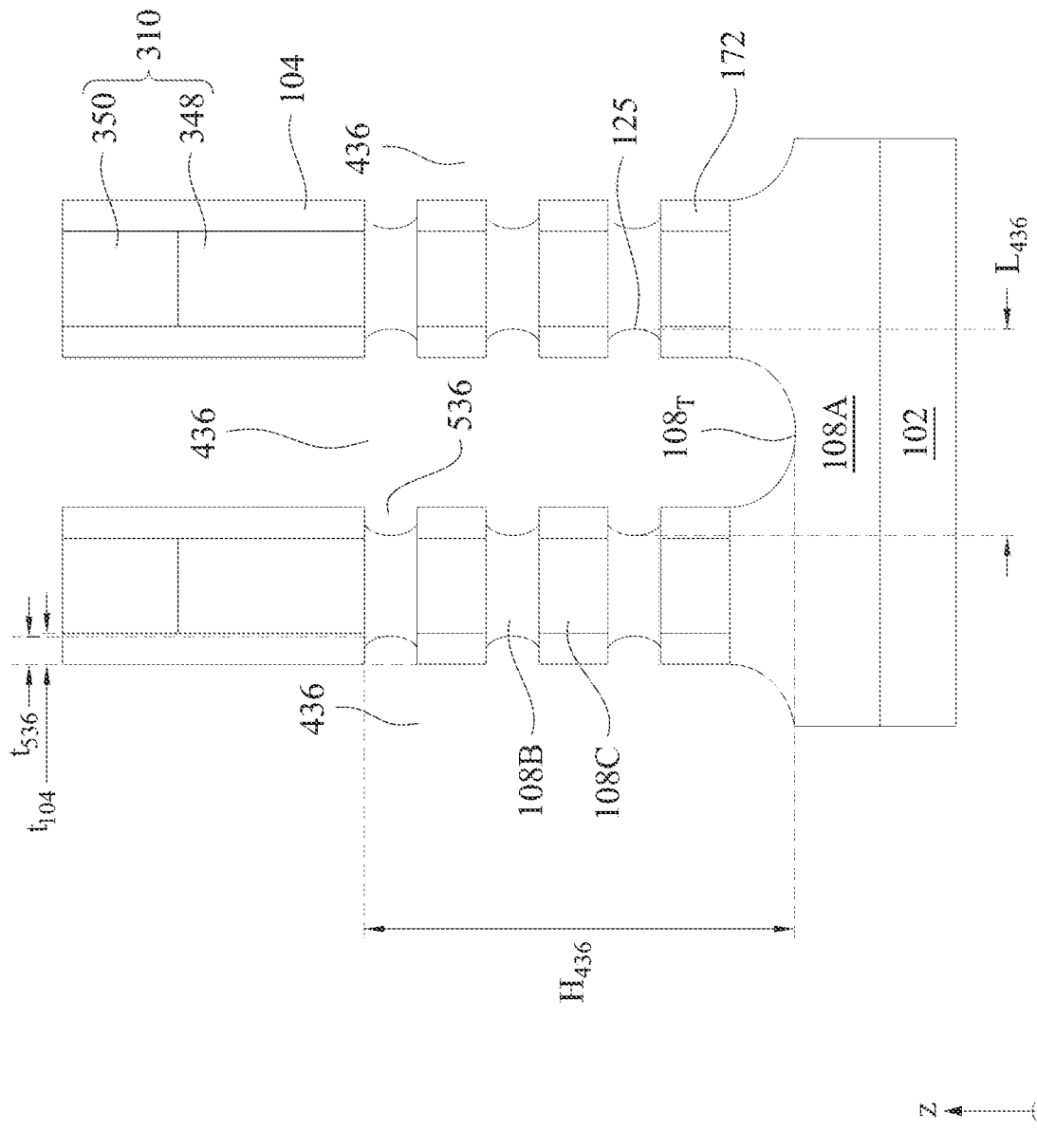
Figure 6:
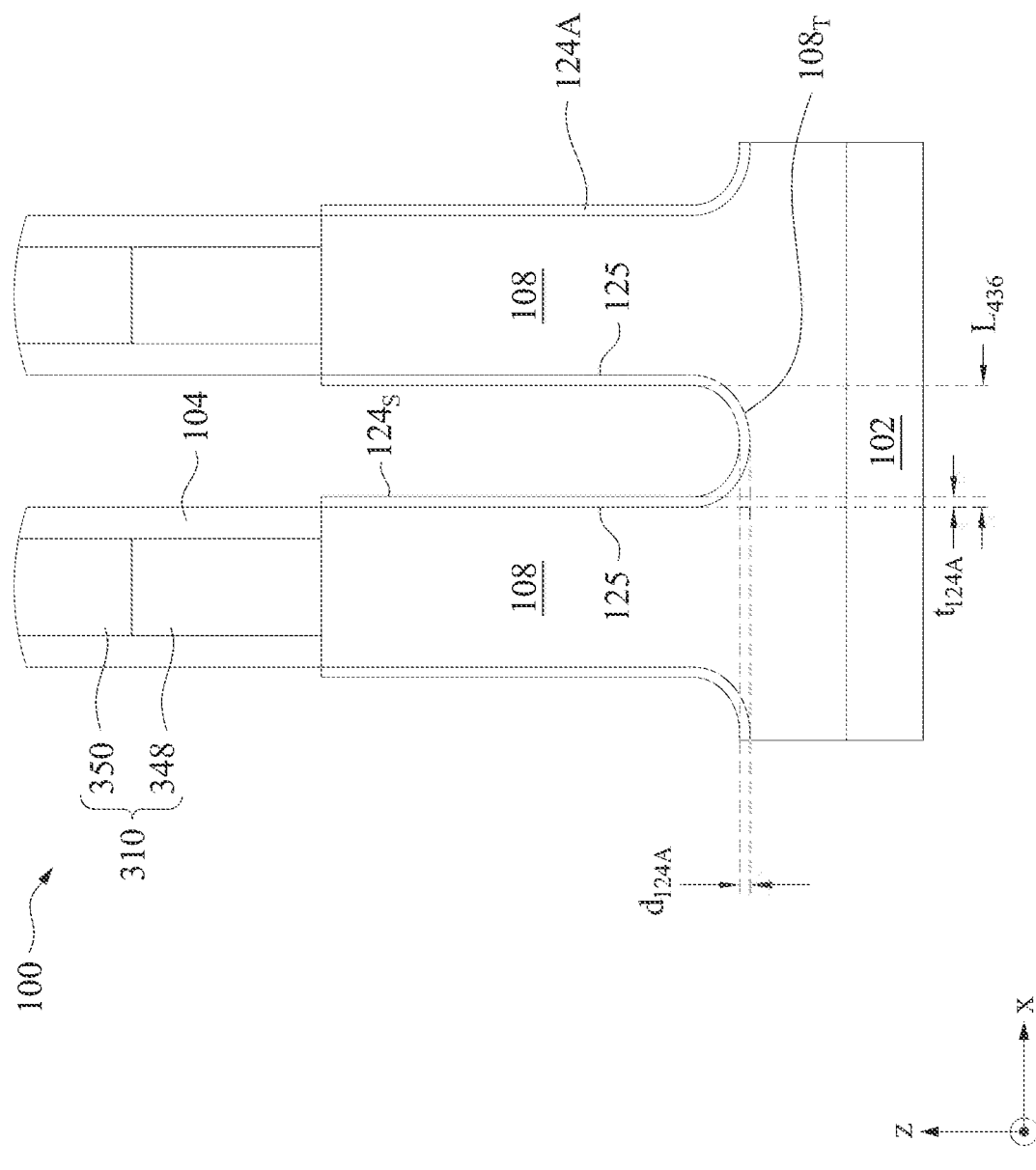

In some embodiments, referring to FIG. 5, method 200 can achieve FETs 101 as GAA FETs, where providing substrate 102 can include epitaxially growing nano-sheet layers 108B and sacrificial layers 108C over substrate 102 using an epitaxial growth process. Sacrificial layer 108C can be made of a semiconductor material having a lattice constant substantially equal to (e.g., lattice mismatch within 5%) that of substrate 102. For example, nano-sheet layer 108B can be made of silicon, while sacrificial layer 108C can be made of SiGe. The epitaxial growth process for growing nano-sheet layers 108B and sacrificial layers 108C can include (i) a CVD process, such as a low pressure CVD (LPCVD) process, a rapid thermal CVD (RTCVD) process, a metal-organic CVD (MOCVD) process, an atomic layer CVD (ALCVD) process, an ultrahigh vacuum CVD (UHVCVD) process, and a reduced pressure CVD (RPCVD) process; (ii) a molecular beam epitaxy (MBE) processes; (iii) an epitaxial deposition/partial etch process, such as a cyclic deposition-etch (CDE) process; or (iv) a selective epitaxial growth (SEG) process. Further, the epitaxial growth process can include applying dopant precursor gases to in-situ doped nano-sheet layers 108B and sacrificial layers 108C. For p-type in-situ doping, p-type doping precursors, such as diborane ($B_2H_6$) and boron trifluoride ($BF_3$), can be used. For n-type in-situ doping, n-type doping precursors, such as phosphine ($PH_3$) and arsine ($AsH_3$), can be used.

Figure 4:
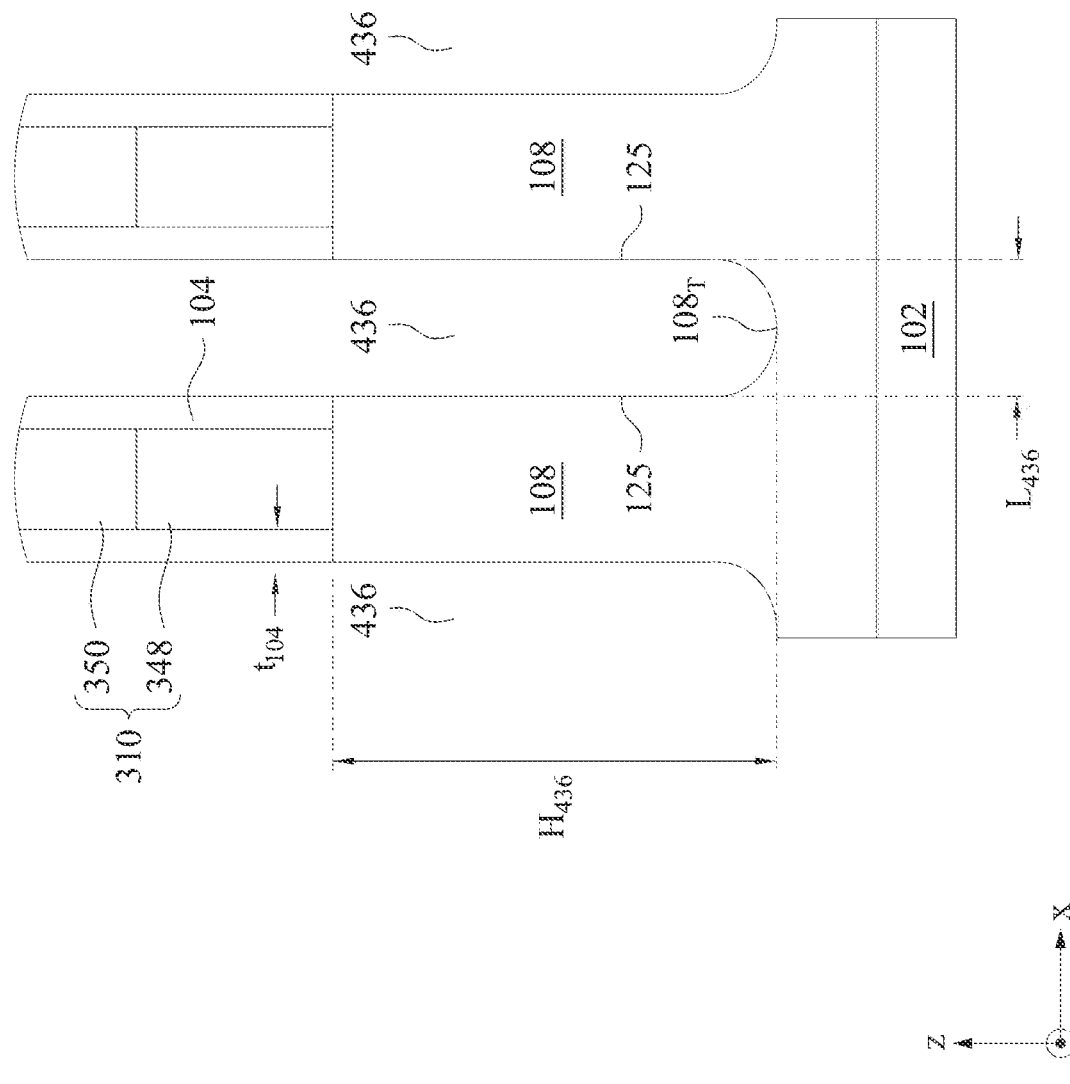

Referring to FIG. 4, after forming sacrificial gate structure 310, recess structure 436 can be formed by removing fin structures 108 through sacrificial gate structures 310 using an etching process. The etching process can include a dry etch process or a wet etch process. In some embodiments, the etching process can be a timed etch process. In some embodiments, the dry etch process can include using any suitable etchant, such as an oxygen-containing gas, a fluorine-containing gas, a chlorine-containing gas, and a bromine-containing gas, and the wet etch process can include etching in any suitable wet etchant, such as diluted hydrofluoric acid, potassium hydroxide solution, ammonia, and nitric acid. The resulting recess structure 436 can expose two opposite side surfaces 125 separated by a length $L_{436}$. Further, the resulting recess structure 436 can protrude into fin structure 108 with a depth $H_{436}$ to define top surface $108_T$ of portions of fin structure 108 that are laterally (e.g., in the x-direction) outside sacrificial gate structure 310. In some embodiments, length $L_{436}$ can be any suitable dimension, such as from about 10 nm to about 30 nm. In some embodiments, depth $H_{436}$ can be any suitable dimension, such as from about 50 nm to about 100 nm. Based on the disclosure herein, other lengths and depths of recess structures 436 are within the spirit and scope of this disclosure.

In some embodiments, referring to FIG. 5, method 200 can achieve FETs 101 as GAA FETs, where operation 205 can further include (i) forming inner spacers 172 protruding into sacrificial layers 108C; and (ii) forming recess structures 536 in nano-sheet layers 108B. The process of forming inner spacers 172 can include forming a recess structures (not shown in FIG. 5) in sacrificial layers 108C, and filling the recess structures with a dielectric material using a deposition process, such as a CVD process. The process of forming recess structures 536 can include removing portions of nano-sheet layers 108B under sacrificial gate structures 310 and gate spacers 104 using an etching process. The etching process can include a dry etch process or a wet etch process. In some embodiments, the etching process can be a timed etch process. In some embodiments, the dry etch process can include using any suitable etchant, such as a fluorine-containing gas, a chlorine-containing gas, and a bromine-containing gas, and the wet etch process can include etching in any suitable wet etchant, such as diluted hydrofluoric acid, potassium hydroxide solution, ammonia, and nitric acid. In some embodiments, the resulting recess structure 536 can have a lateral (e.g., in the x-direction) dimension $t_{536}$ substantially equal to first layer 124A's vertical thickness $d_{124A}$.

Referring to FIG. 2, in operation 210, a first epitaxial region is formed in the recess structure. For example, method 200 can achieve FETs 101 as finFETs, where first layer 124A can be formed in recess structure 436 (shown in FIG. 4) with reference to FIG. 6. In some embodiments, method 200 can achieve FETs 101 as GAA FETs, where first layer 124A can be formed in recess structures 436 and 536 (both shown in FIG. 5) with reference to FIG. 7. The process of forming first layer 124A can include epitaxially growing a semiconductor material of vertical thickness $d_{124A}$ measured from top surface $108_T$ (shown in FIG. 4 for FETs 101 as finFETs; or shown in FIG. 5 for FETs 101 as GAA FETs) using an epitaxial growth process. The epitaxial growth process can further grow first layer 124A with lateral thickness $t_{124A}$ over side surfaces 125, while exposing sacrificial gate structures 310. In some embodiments, because the epitaxial growth process can have a higher grow rate over (100) crystal planes than over (110) or (111) crystal planes, thickness $d_{124A}$ can be greater than or substantially equal to thickness $t_{124A}$. In some embodiments, a ratio of lateral thickness $t_{124A}$ to length $L_{436}$ can be from about 0.05 to about 0.85, from about 0.1 to about 0.65, or from about 0.1 to about 0.5 that allows first layer 124A to assist dopant diffusion from second layer 124B. If the ratio of lateral thickness $t_{124A}$ to length $L_{436}$ is below the above-noted lower limits, first layer 124A may not provide sufficient driving force to assist dopant diffusion from second layer 124B. If the ratio of lateral thickness $t_{124A}$ to length $L_{436}$ is beyond the above-noted upper limits, FET 101 may be susceptible to a high contact resistance. The epitaxial growth process can include (i) a CVD process, such as a LPCVD process, a RTCVD process, a MOCVD process, an ALCVD process, an UHVCVD process, and a RPCVD process; (ii) a MBE processes; (iii) an epitaxial deposition/partial etch process, such as a CDE process; or (iv) a SEG process. The epitaxial process can be conducted using suitable processing gases associated with the semiconductor material of first layer 124A. For example, first layer 124A can include SiGe, where the processing gases can include silane (SiH$_4$), disilane (Si$_2$H$_6$), dichlorosilane (DCS), germane (GeH$_4$), hydrogen (H$_2$), and nitrogen (N$_2$). In some embodiments, the process of forming first layer 124A can further include doping the grown semiconductor layer with dopants during the epitaxial growth process. For example, the epitaxial growth process can include applying PH$_3$ or arsine AsH$_3$ to in-situ doped first layer 124A. Based on the disclosure herein, other epitaxial growth processes, processing gases, and dopant precursor gases for forming first layer 124A are within the spirit and scope of this disclosure.

Figure 7:
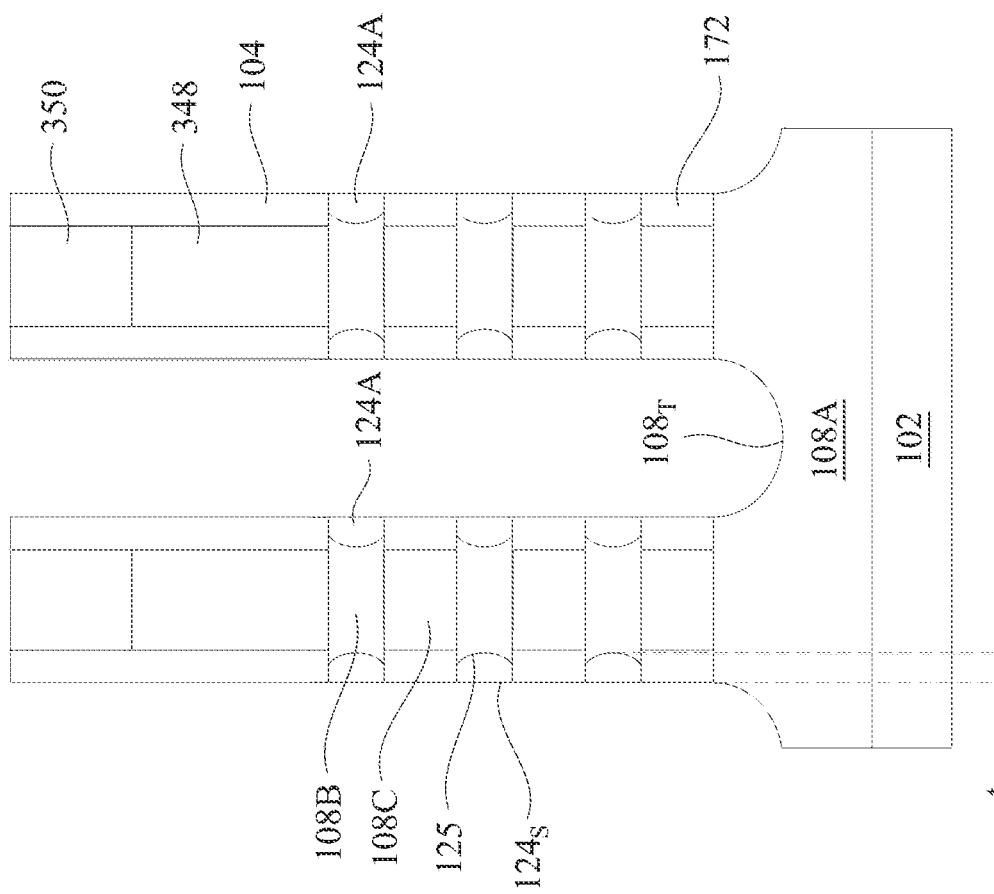
Figure 8:
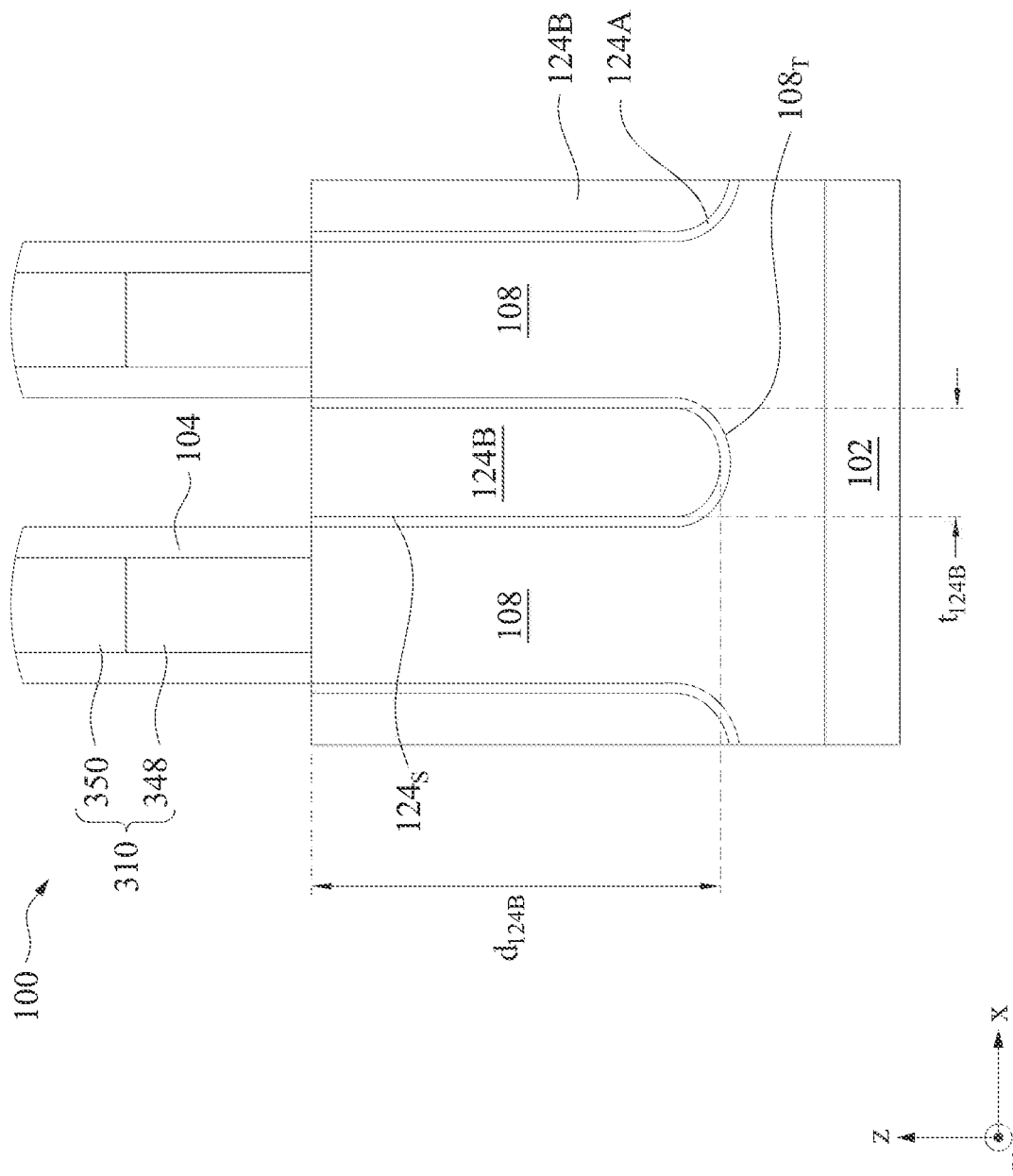
Figure 9:
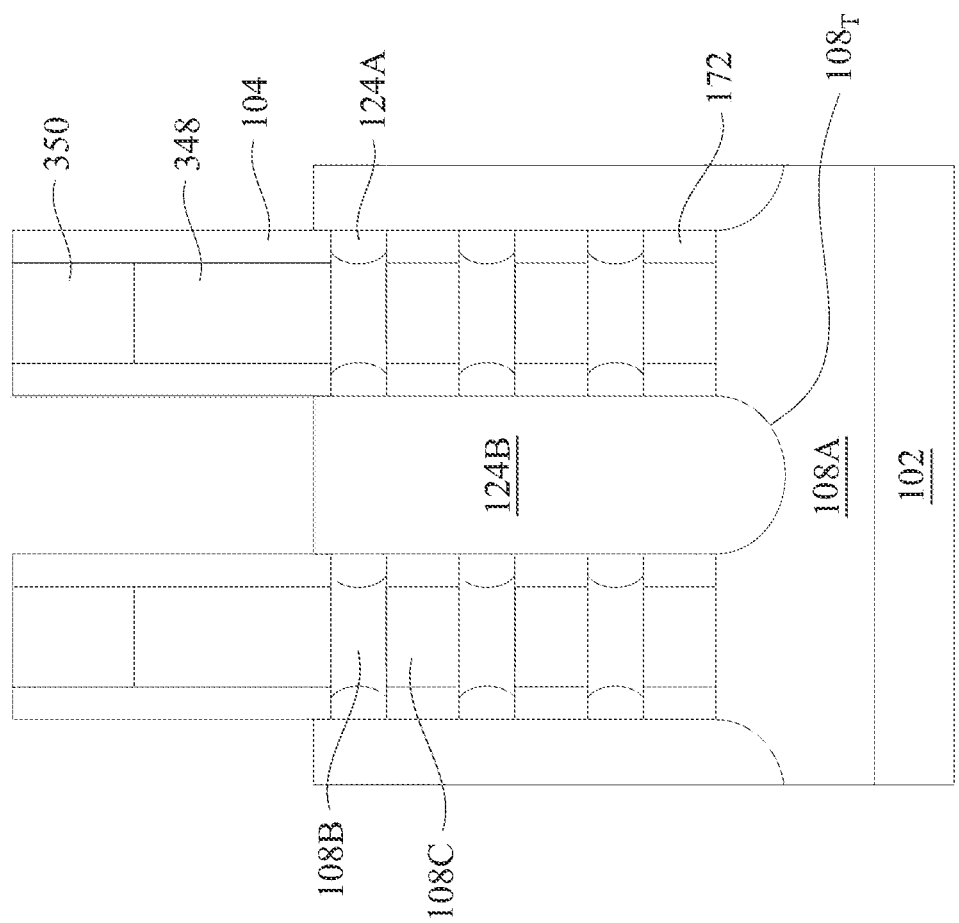
Figure 10:
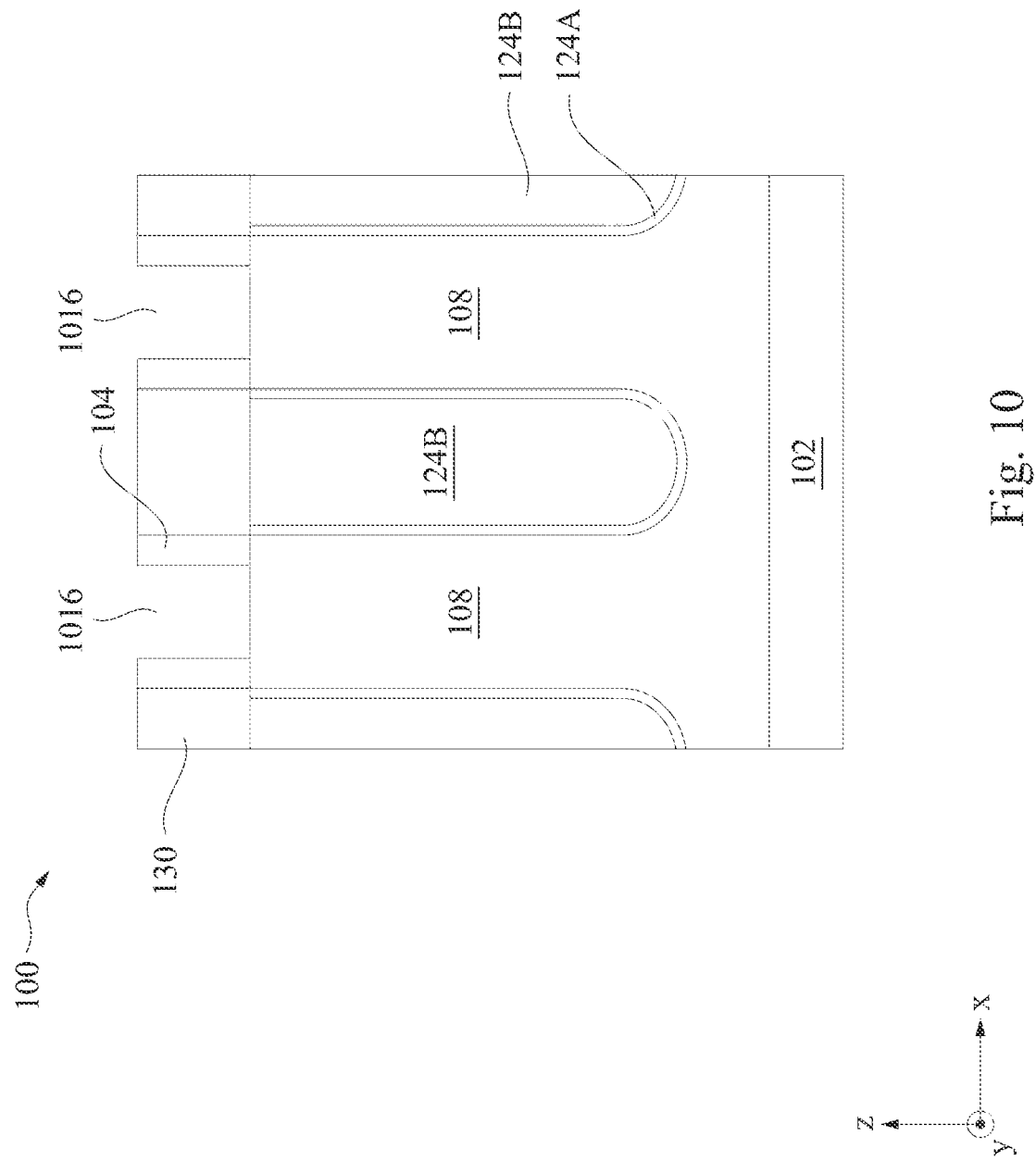

In some embodiments, referring to FIG. 7, method 200 can achieve FETs 101 as GAA FETs, where operation 215 can further include (i) epitaxially growing first layers 124A in recess structures 436 and 536 of FIG. 5; and (ii) removing first layer 124A through sacrificial gate structures 310, gate spacers 104, and inner spacers 172 using an etching process. Accordingly first layers 124A can be formed protruding into portions of fin structure 108 that are under sacrificial gate structure 310 and gate spacer 104. The etching process can be a selective etching process that can etch first layers 124A from fin structure 108. In some embodiments, after the etching process, top surface $108_T$ can be exposed, while first layers 124A can be formed vertically between two adjacent inner spacers 172.

Referring to FIG. 2, in operation 215, a second epitaxial region is formed over the first epitaxial region. For example, method 200 can achieve FETs 101 as finFETs, where second layer 124B can be formed over first layer 124A with reference to FIG. 8. In some embodiments, method 200 can achieve FETs 101 as GAA FETs, where second layer 124B can be formed over first layer 124A and in contact with fin structure 108, such as in contact with top surface $108_T$ with reference to FIG. 9. The process of forming second layer 124B can include epitaxially growing a semiconductor material of vertical thickness $d_{124B}$ over first layer 124A using an epitaxial growth process similar to that for growing first layer 124A. The process of forming second layer 124B can further include doping the grown semiconductor layer by including the dopant precursor gases, such as PH$_3$ and arsine AsH$_3$, in the epitaxial growth process. In some embodiments, second layer 124B is free from SiGe (e.g., does not contain SiGe or Ge), where the epitaxial process can be free from germanium-contained gases (e.g., the epitaxial process does not use a processing gas that contains germanium). In some embodiments, first layer 124A can contain higher germanium concentration than the second layer 124B, where the epitaxial growth process can include supplying higher flow rate of germanium-contained gases (e.g., process gases, such as GeH$_4$, which includes germanium) for growing first layer 124A than second layer 124B. In some embodiments, first layer 124A can have a higher germanium concentration than second layer 124B, where the epitaxial growth process can include supplying germanium-contained gases (e.g., GeH$_4$) with a monotonically decreasing flow rate over time for growing first layer 124A than second layer 124B. In some embodiments, first layer 124A can have a higher germanium concentration than second layer 124B, where the epitaxial growth process can include (i) supplying a germanium-contained gas (e.g., a process gas, such as GeH$_4$, that includes germanium) for growing first layer 124A, and (ii) supplying a germanium-free gas (e.g., a process gas, such as SiH$_4$, that does not include germanium) for growing second layer 124B. Based on the disclosure herein, other epitaxial growth processes, processing gases, and dopant precursor gases for forming second layer 124B are within the spirit and scope of this disclosure.

Figure 11:
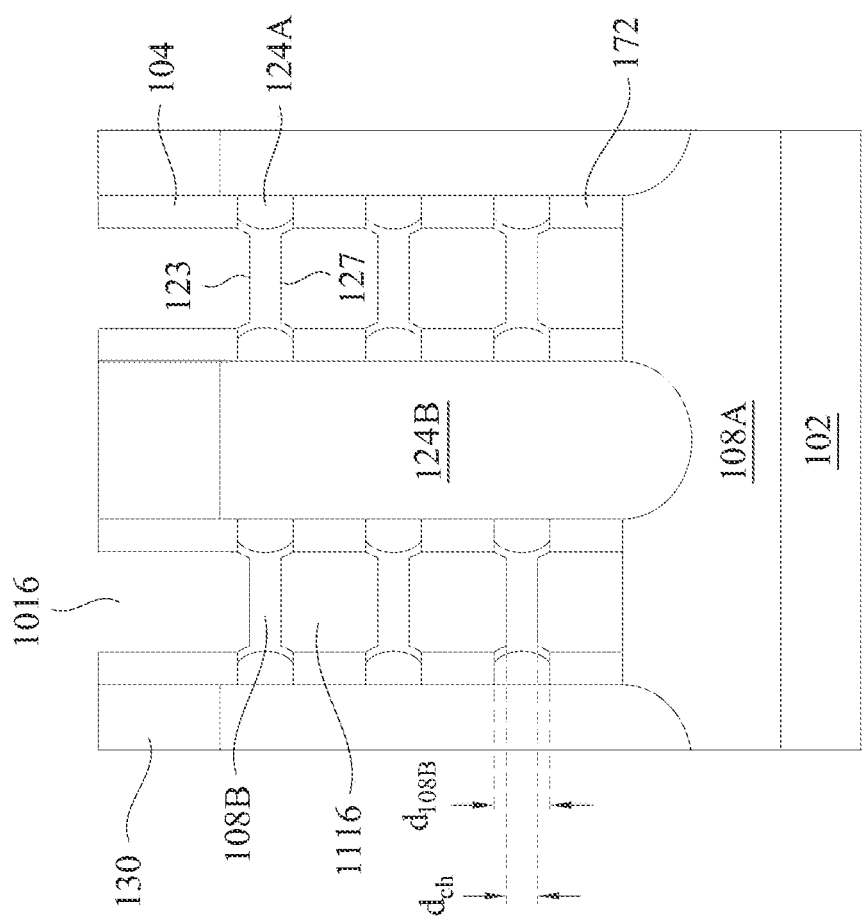

Referring to FIG. 2, in operation 220, the sacrificial gate structure is replaced with a metal gate structure. For example, method 200 can achieve FETs 101 as finFETs, where sacrificial gate structure 310 can be replaced with gate structure 110 (shown in FIG. 1C) with reference to FIG. 10. In some embodiments, method 200 can achieve FETs 101 as GAA FETs, where sacrificial gate structure 310 can be replaced with gate structure 110 (shown in FIGS. 1D and 1E) with reference to FIG. 11. The process of forming gate structure 110 can include (i) forming ILD layer 130 over second layer 124B using a suitable deposition process, such as a PVD process and a CVD process; (ii) removing hard mask layer 350 to coplanarizing polysilicon layer 348 with ILD layer 130 using a polishing process, such as a CMP process; (iii) removing polysilicon layer 348 to form a recess structure 1016 to expose fin structures 108 using an etching process; and (iv) filling gate dielectric layer 112 and a gate electrode 114 in recess structures 1016 using a suitable deposition process, such as ALD, CVD, and PVD. In some embodiments, as shown in FIG. 11, method 200 can achieve FETs 101 as GAA FETs, where the process of forming recess structure 1016 can further include (i) forming recess structures 1116 by removing sacrificial layers 108C using a selective etching process; (ii) thinning nano-sheet layers 108B through inner spacers 172 and gate spacer 104 using an etching process (e.g., reducing nano-sheet layer 108B's thickness from $d_{108B}$ to $d_{ch}$); and (iii) filling gate dielectric layer 112 and a gate electrode 114 in recess structures 1116 using the suitable deposition process. Based on the disclosure herein, other processes for forming gate structure 110 are within the spirit and scope of this disclosure.

After operation 220, a metal contact, such as trench conductor structure 150 (shown in FIGS. 1A-1E), can be formed over S/D region 124 and/or gate structure 110. The process of forming trench conductor structure 150 can include (i) blanket depositing layer of insulating material 148 over gate structure 110 and S/D region 124 via a suitable deposition process, such as a CVD process, a PVD process, and a ALD process; (ii) forming a recess structure (not shown in all figures) through layer of insulating material 148 and ILD layer 130 and using a lithography process and an etching process; (iii) forming silicide layer 152 (shown in FIGS. 1B-1E) in the recess structure; and (iv) forming layer of conductive material 154 (shown in FIGS. 1B-1E) over silicide layer 152 using a suitable deposition process (e.g., a CVD process, an ALD process, a PVD process, and an e-beam evaporation process) and a polishing process (e.g., a CMP process). Based on the disclosure herein, other processes for forming trench conductor structure 150 are within the spirit and scope of this disclosure.

The present disclosures provides an exemplary transistor S/D structure and a method for forming the same. The transistor can be an NFET, where the transistor's S/D structure can be n-type and includes a diffusion enhancement layer and an n-type semiconductor layer. The diffusion enhancement layer can enhance the dopants diffusing from the n-type semiconductor layer towards the transistor's channel region. In some embodiments, the diffusion enhancement layer can include a SiGe layer. In some embodiments, the n-type semiconductor layer can be a non-germanium layer to avoid inducing compressive stress in the transistor's channel region to degrade the transistor's electron mobility. In some embodiments, the n-type semiconductor layer can be made of a silicon layer, a silicon phosphorus layer, and a silicon arsenic layer. A benefit of the S/D structures, among others, is to reduce the transistor channel resistance, thus improving transistor performance.

In some embodiments, a method can include providing a substrate having a first semiconductor layer with a first lattice constant, forming a recess structure in the substrate, forming a second semiconductor layer with a second lattice constant in the recess structure, and forming a third semiconductor layer over the second semiconductor layer. The second lattice constant can be greater than the first lattice constant. The process of forming the third semiconductor layer can include doping the third epitaxial layer with an n-type dopant.

In some embodiments, a method can include forming a fin structure over a substrate, forming a gate structure over the fin structure, forming a recess structure in the fin structure and adjacent to the gate structure, forming a silicon germanium layer in the recess structure, and forming an n-type source/drain region over the silicon germanium layer.

In some embodiments, a semiconductor structure can include a substrate, a fin structure over the substrate, a gate structure over a first portion of the fin structure, and an epitaxial region formed in a second portion of the fin structure. The epitaxial region can include a first semiconductor layer and an n-type second semiconductor layer formed over the first semiconductor layer. A lattice constant of the first semiconductor layer can be greater than that of the second semiconductor layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin structure on a substrate;
   forming a first recess in a first portion of the fin structure;
   forming a plurality of channel layers in a second portion of the fin structure;
   forming a gate structure that wraps around each channel layer of the plurality of channel layers;
   forming a second recess in a side portion of each channel layer of the plurality of channel layers, wherein the second recess is formed below an inner spacer of the gate structure;
   forming a first epitaxial layer in the second recess in the side portion of each channel layer of the plurality of channel layers;
   recessing a top surface and a bottom surface of each channel layer of the plurality of channel layers;
   forming a gate dielectric layer of the gate structure in the recessed top surface and bottom surface of each channel layer of the plurality of channel layers; and
   forming a second epitaxial layer in the first recess in the first portion of the fin structure.

2. The method of claim 1, further comprising performing a timed etching process to control a lateral width of the second recess in the side portion of each channel layer of the plurality of channel layers.

3. The method of claim 1, further comprising forming the inner spacer of the gate structure with a lateral width substantially equal to or greater than a lateral width of the first epitaxial layer.

4. The method of claim 1, wherein forming the second recess in the side portion of each channel layer comprises etching a side portion of each channel layer of the plurality of channel layers.

5. The method of claim 4, further comprising etching the side portion of the channel layer through the first recess in the first portion of the fin structure.

6. The method of claim 1, wherein forming the second epitaxial layer comprises:
growing the second epitaxial layer using an epitaxial growth process; and
doping the second epitaxial layer with a dopant precursor gas during the epitaxial growth process.

7. The method of claim 1, wherein forming the first epitaxial layer comprises flowing a germanium-containing gas at a first flow rate, and wherein forming the second epitaxial layer comprises flowing the germanium-containing gas at a second flow rate lower than the first flow rate.

8. A method, comprising:
forming a fin structure on a substrate;
forming an opening in a first portion of the fin structure;
forming a gate structure in a second portion of the fin structure, comprising:
 forming a plurality of nano-sheet layers adjacent to the opening, wherein the gate structure wraps around each nano-sheet layer of the plurality of nano-sheet layers;
 forming first recesses in side portions of each nano-sheet layer of the plurality of nano-sheet layers;
 forming a first epitaxial layer within the first recesses;
 removing a portion of each nano-sheet layer of the plurality of nano-sheet layers to form second recesses in a top surface and a bottom surface of the nano-sheet layer, wherein the top and bottom surfaces are parallel to the substrate; and
 forming a dielectric layer of the gate structure within the second recesses in the top surface and the bottom surface of each nano-sheet layer of the plurality of nano-sheet layers; and
forming, within the opening, a second epitaxial layer in contact with the first epitaxial layer.

9. The method of claim 8, wherein forming the first epitaxial layer comprises flowing a germanium-containing gas at a first flow rate, and wherein forming the second epitaxial layer comprises flowing the germanium-containing gas at a second flow rate lower than the first flow rate.

10. The method of claim 8, wherein forming the second epitaxial layer comprises:
growing the second epitaxial layer using an epitaxial growth process; and
doping the second epitaxial layer with a dopant precursor gas during the epitaxial growth process.

11. The method of claim 8, wherein forming the first epitaxial layer comprises epitaxially growing a silicon germanium layer.

12. The method of claim 8, wherein forming the second epitaxial layer comprises epitaxially growing a silicon layer doped with phosphorous or arsenic over the first epitaxial layer.

13. The method of claim 8, wherein forming the gate structure further comprises forming a gate electrode on the dielectric layer within the second recesses in the top surface and bottom surface of each nano-sheet layer of the plurality of nano-sheet layers.

14. The method of claim 8, wherein forming first recesses comprises etching the side portion of each nano-sheet layer of the plurality of nano-sheet layers through the opening in the first portion of the fin structure.

15. A semiconductor structure, comprising:
a fin structure on a substrate;
a plurality of nano-sheet layers in a first portion of the fin structure, wherein:
 a gate structure wraps around each nano-sheet layer of the plurality of nano-sheet layers, and
 a dielectric layer of the gate structure protrudes into a top surface and bottom surface of each nano-sheet layer of the plurality of nano-sheet layers;
a first epitaxial layer in a second portion of the fin structure, wherein the first epitaxial layer protrudes into a side surface of each nano-sheet layer of the plurality of nano-sheet layers, and wherein the first epitaxial layer is disposed below an inner spacer of the gate structure; and
a second epitaxial layer in the second portion of the fin structure and in contact with a bottom surface and a sidewall surface of the first epitaxial layer.

16. The semiconductor structure of claim 15, wherein the inner spacer is disposed between the gate structure and the second epitaxial layer.

17. The semiconductor structure of claim 16, wherein a lateral thickness of the first epitaxial layer is greater than a lateral thickness of the inner spacer.

18. The semiconductor structure of claim 15, wherein a thickness of each nano-sheet layer of the plurality of nano-sheet layers is less than a thickness of the first epitaxial layer in a direction perpendicular to the substrate.

19. The semiconductor structure of claim 15, wherein a side surface of the first epitaxial layer protruding into the side surface of each nano-sheet layer of the plurality of nano-sheet layers has a curved or warped shape.

20. The semiconductor structure of claim 15, wherein a lattice constant of the first epitaxial layer is greater than a lattice constant of the second epitaxial layer.

* * * * *